United States Patent
Lee et al.

(10) Patent No.: US 12,251,727 B2
(45) Date of Patent: Mar. 18, 2025

(54) MASK DEVICE AND METHOD OF COATING RESIN USING THE SAME

(71) Applicant: Samsung Display Co., Ltd., Yongin-si (KR)

(72) Inventors: Junyoung Lee, Yongin-si (KR); Jeongweon Seo, Yongin-si (KR); Hyuk-Hwan Kim, Yongin-si (KR); Junwoo You, Yongin-si (KR); Jeongho Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/310,637

(22) Filed: May 2, 2023

(65) Prior Publication Data
US 2024/0100561 A1 Mar. 28, 2024

(30) Foreign Application Priority Data

Sep. 23, 2022 (KR) .................. 10-2022-0120709

(51) Int. Cl.
*B05D 1/32* (2006.01)
*H05K 3/00* (2006.01)
*H05K 5/02* (2006.01)

(52) U.S. Cl.
CPC ............. *B05D 1/32* (2013.01); *H05K 3/0073* (2013.01); *H05K 5/02* (2013.01)

(58) Field of Classification Search
CPC ........... B05D 1/32; H05K 3/0073; H05K 5/02
USPC .................................................. 427/98.4, 282
See application file for complete search history.

(56) References Cited

U.S. PATENT DOCUMENTS

| | | | | |
|---|---|---|---|---|
| 4,243,695 | A * | 1/1981 | Wengert | H01J 9/2277 427/68 |
| 6,689,412 | B1 * | 2/2004 | Bourrieres | H01L 24/11 427/372.2 |
| 7,282,240 | B1 * | 10/2007 | Jackman | B82Y 40/00 427/282 |
| 9,284,638 | B2 * | 3/2016 | Ko | B05C 21/005 |
| 9,773,956 | B2 * | 9/2017 | Richter | B05D 1/32 |
| 11,417,847 | B2 * | 8/2022 | Ko | H10K 71/166 |
| 11,527,718 | B2 * | 12/2022 | Jung | H10K 71/166 |
| 11,578,400 | B2 * | 2/2023 | Zhang | H10K 71/00 |
| 2003/0221614 | A1 * | 12/2003 | Kang | H10K 71/166 118/504 |
| 2008/0230118 | A1 * | 9/2008 | Nakatani | H01L 31/022425 428/192 |
| 2012/0234236 | A1 * | 9/2012 | Ko | B05B 12/20 118/504 |

(Continued)

FOREIGN PATENT DOCUMENTS

KR 10-0713693 5/2007

*Primary Examiner* — Brian K Talbot
(74) *Attorney, Agent, or Firm* — KILE PARK REED & HOUTTEMAN PLLC

(57) ABSTRACT

A mask device includes a mesh mask and a metal mask disposed under the mesh mask. The mesh mask includes a mesh pattern and a plurality of first blocking portions disposed in the mesh pattern to block portions of the mesh pattern, the metal mask includes a plurality of second blocking portions overlapping the first blocking portions in a plan view, and the metal mask is provided with an accommodation opening defined through in the metal mask, and not overlapping the first blocking portions in a plan view.

9 Claims, 13 Drawing Sheets

(56) References Cited

U.S. PATENT DOCUMENTS

| | | | |
|---|---|---|---|
| 2013/0140591 A1* | 6/2013 | Tseng | H01L 33/504 |
| | | | 257/E33.059 |
| 2013/0168703 A1* | 7/2013 | Mei | H01L 33/50 |
| | | | 438/27 |
| 2017/0036230 A1* | 2/2017 | Mizumura | B05D 7/24 |
| 2017/0110661 A1* | 4/2017 | Lee | H10K 71/13 |
| 2017/0130321 A1* | 5/2017 | Mizumura | C23C 14/086 |
| 2019/0305222 A1* | 10/2019 | Jung | H10K 59/873 |
| 2020/0208250 A1* | 7/2020 | Kim | C23C 14/14 |
| 2021/0083189 A1* | 3/2021 | Moon | C23C 14/042 |
| 2021/0376008 A1* | 12/2021 | Tan | H10K 59/353 |

* cited by examiner

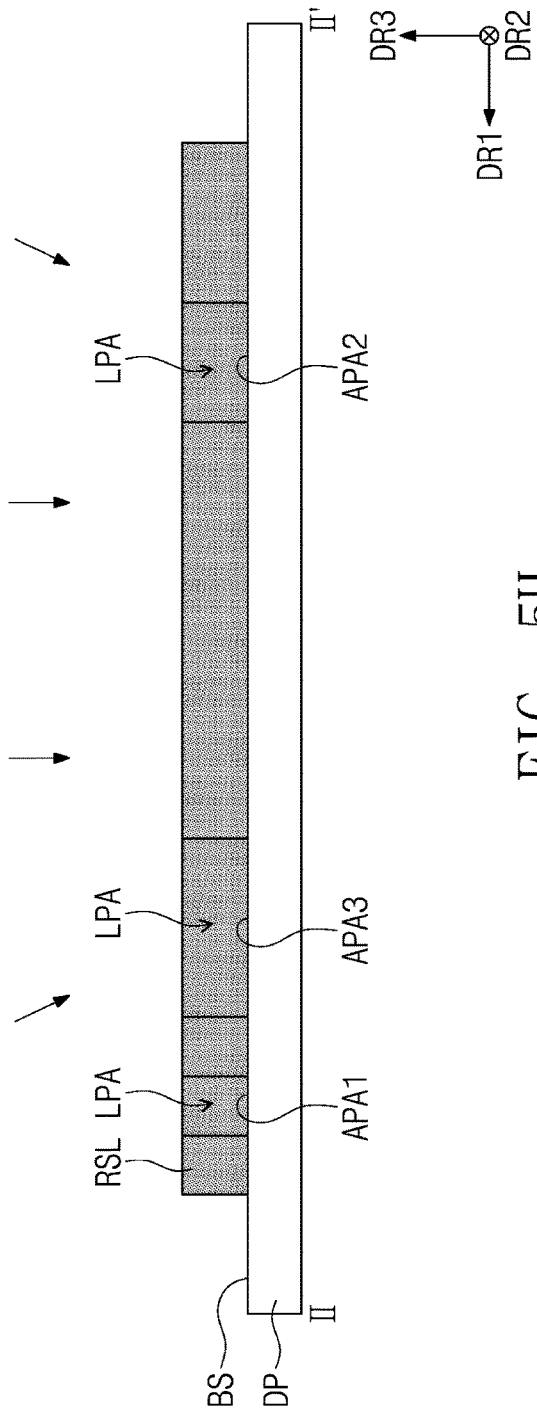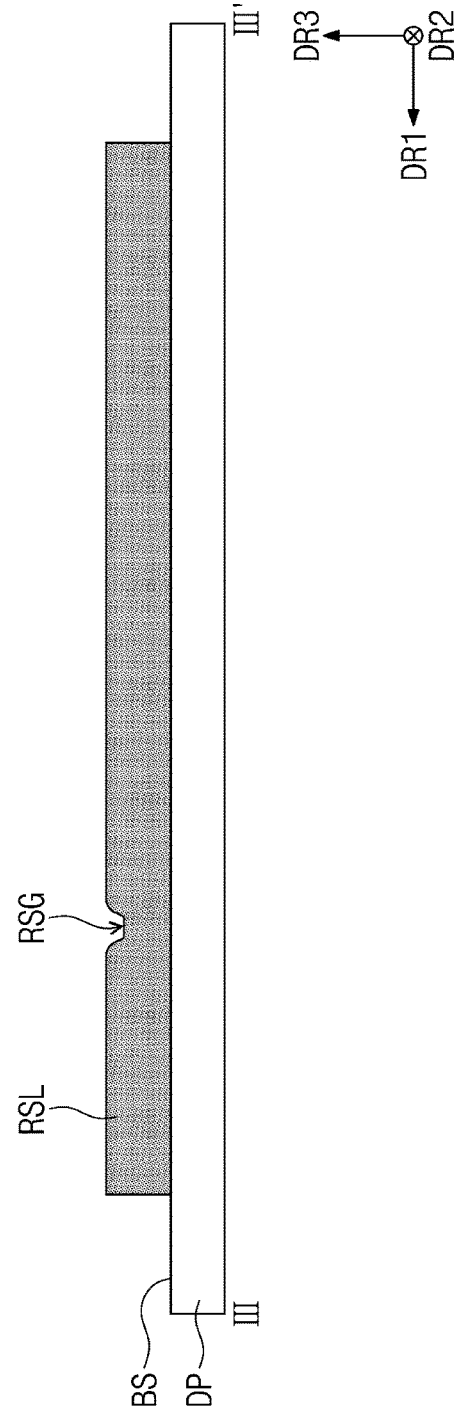

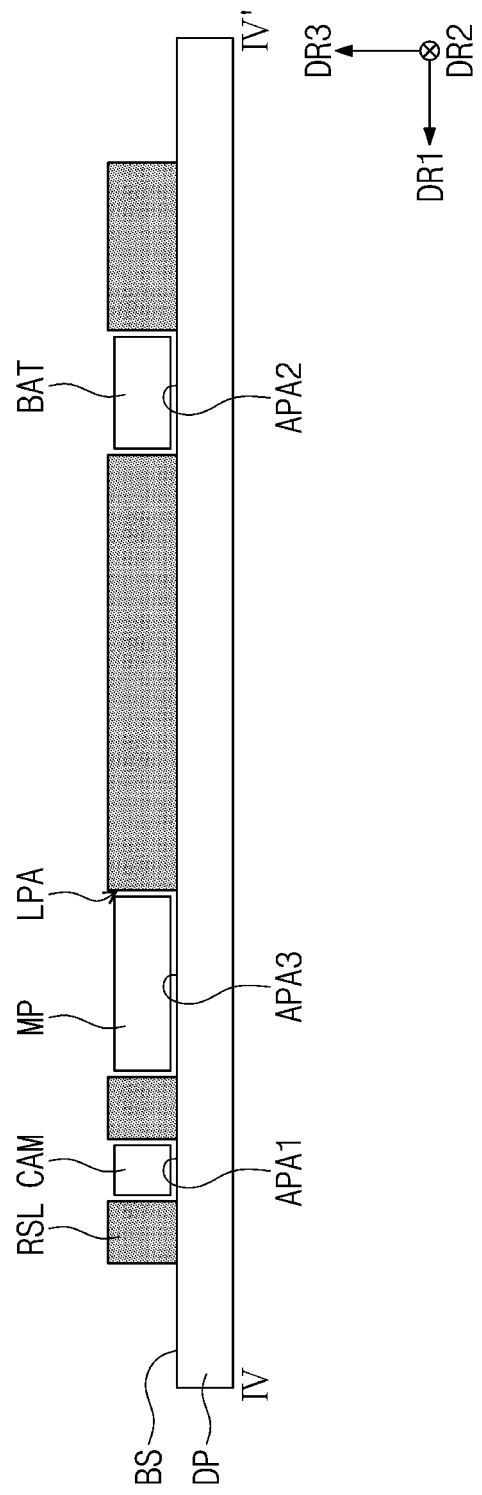

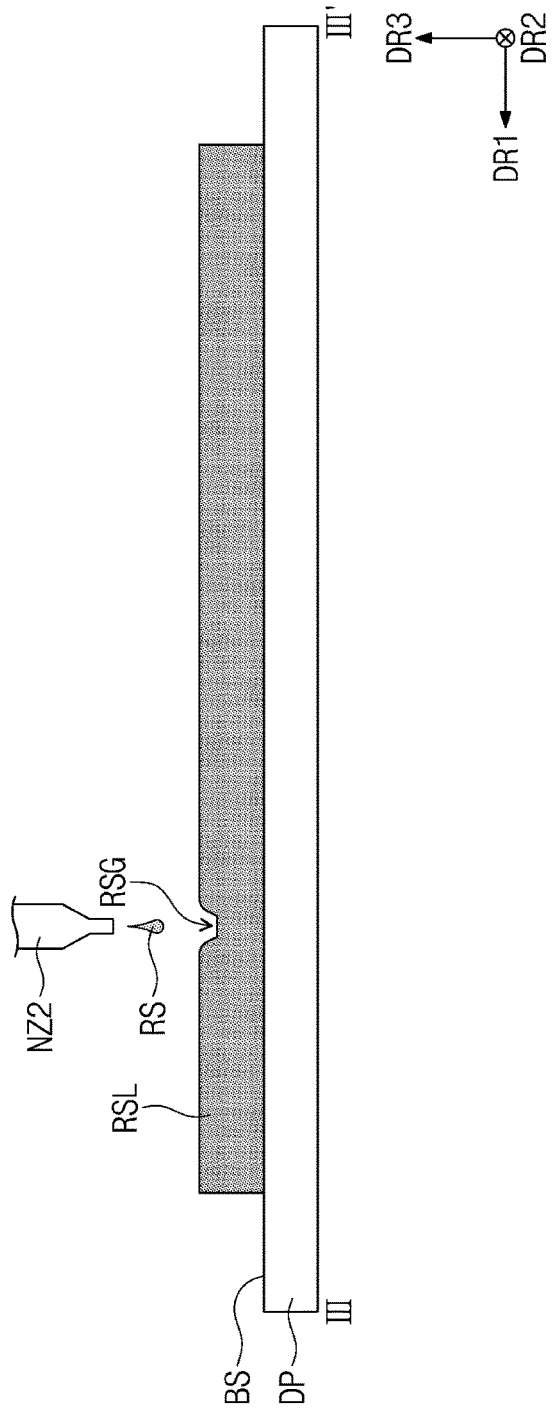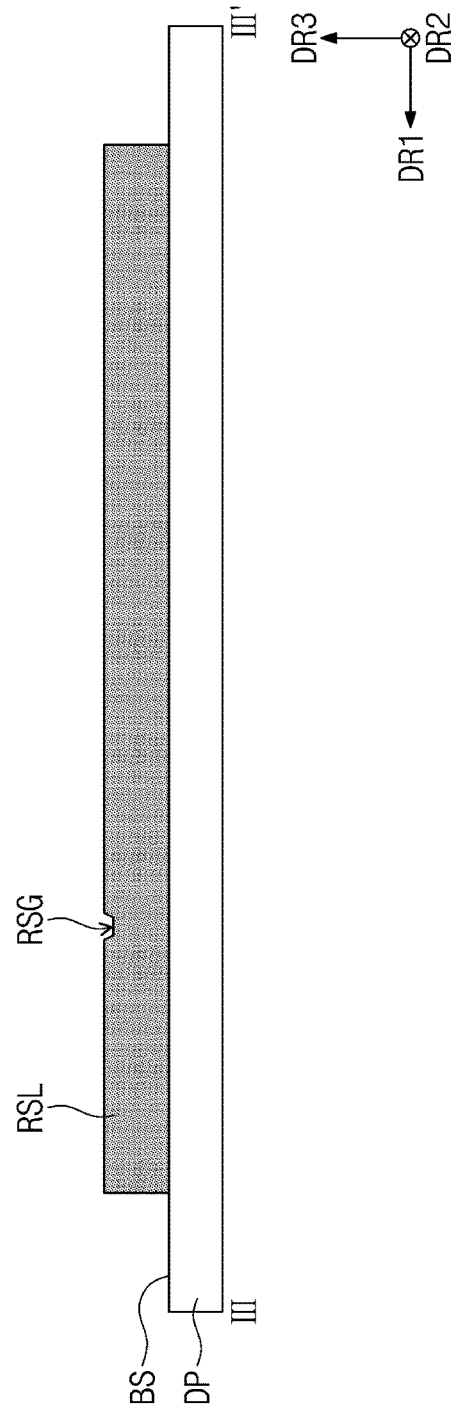

MASK DEVICE AND METHOD OF COATING RESIN USING THE SAME

CROSS REFERENCE TO RELATED APPLICATION(S)

This application claims priority to and the benefit of Korean Patent Application No. 10-2022-0120709 under 35 U.S.C. § 119, filed on Sep. 23, 2022 in the Korean Intellectual Property Office (KIPO), the entire contents of which are incorporated herein by reference.

BACKGROUND

1. Technical Field

The disclosure relates to a mask device and a method of coating a resin using the mask device.

2. Description of the Related Art

An electronic device, such as a smartphone, a digital camera, a notebook computer, a navigation device, a smart television, and the like, includes a display device displaying an image. The display device generates the image and provides the image to a user through a display screen. The electronic device includes components such as a camera, a battery, a central processing portion, and the like.

The display device includes a display panel. The components, such as the camera, the battery, the central processing portion, and the like, of the electronic device are disposed on a rear surface of the display panel. A pattern is formed on the rear surface of the display panel to arrange the components, such as the camera, the battery, the central processing portion, and the like. The pattern is formed by coating a resin.

SUMMARY

The disclosure provides a mask device capable of coating a resin on a rear surface of a display panel.

The disclosure provides a method of coating a resin using the mask device.

Embodiments of the disclosure provide a mask device including a mesh mask and a metal mask disposed under the mesh mask. The mesh mask may include a mesh pattern and a plurality of first blocking portions disposed in the mesh pattern to block portions of the mesh pattern, the metal mask may include a plurality of second blocking portions overlapping the first blocking portions in a plan view, and the metal mask may be provided with an accommodation opening defined through in the metal mask and not overlapping the first blocking portions when viewed in the plane.

The mesh mask may further include a first frame having a frame shape to define a first opening, and the mesh pattern may be accommodated in the first opening and connected to the first frame.

The metal mask may further include a second frame having a frame shape to define a second opening in which the second blocking portions are disposed, and overlapping the first frame in a plan view; and a plurality of connection wires disposed in the second opening to connect the second blocking portions to the second frame.

The connection wires may be connected to upper portions of the second blocking portions.

The connection wires may extend in a first direction or a second direction crossing the first direction and are connected to the second frame.

The mesh mask may further include a first blocking frame contacting inner surfaces of the first frame and having a frame shape.

The metal mask may further include a second blocking frame contacting inner surfaces of the second frame, having a frame shape, and overlapping the first blocking frame in a plan view.

The first blocking portions may be disposed between mesh openings defined through the mesh pattern in the portions of the mesh pattern.

The mask device may further include a squeezer disposed above the mesh mask and a first nozzle disposed above the mesh mask to spray a resin. The squeezer may push the resin to allow the resin to pass through the mesh pattern.

The resin may be blocked by the first blocking portions and provided to the metal mask after passing through mesh openings defined through in the mesh pattern around the first blocking portions.

The resin may be blocked by the second blocking portions and provided to the accommodation opening around the second blocking portions.

The resin may be provided onto a display panel disposed under the metal mask.

The resin may be provided multiple times onto the display panel.

The resin provided onto the display panel may have a thickness in a range of about 100 micrometers to about 150 micrometers.

The mask device may further include a second nozzle. The metal mask may further include a connection wire, and the second nozzle provides an additional resin to resin grooves defined in the resin overlapping the connection wire when viewed in the plane.

Embodiments of the disclosure provide a method of coating a resin. The coating method of the resin may include placing a metal mask on a display panel, placing a mesh mask on the metal mask, providing a resin on an upper surface of the mesh mask, and providing the resin onto the display panel through the metal mask and the mesh mask. The mesh mask may include a mesh pattern and a plurality of first blocking portions disposed in the mesh pattern to block portions of the mesh pattern, the metal mask may include a plurality of second blocking portions overlapping the first blocking portions in a plan view, the metal mask may be provided with an accommodation opening defined through the metal mask, and not overlapping the first blocking portions in a plan view, and the resin may be provided to the accommodation opening after passing through the mesh pattern around the first blocking portions.

The resin may be blocked by the first blocking portions and provided to the metal mask after passing through mesh openings defined through in the mesh pattern around the first blocking portions.

The resin provided to the metal mask may be blocked by the second blocking portions and provided to the accommodation opening around the second blocking portions.

The mesh mask may further include a first frame having a frame shape to define a first opening, the metal mask may further include a second frame having a frame shape to define a second opening and a plurality of connection wires connecting the second blocking portions to the second frame, the mesh pattern may be connected to inner surfaces of the first frame, and the connection wires may be connected to inner surfaces of the second frame.

Resin grooves may be defined in portions of the resin overlapping the connection wires in a plan view.

According to the above, in case that the resin is coated onto the rear surface of the display panel, the mesh pattern may not contact the display panel because of the metal mask disposed under the mesh pattern even though the mesh pattern is pushed by a squeezer. Since the squeezer is disposed on the mesh mask and does not contact connection wires disposed in the metal mask, the connection wires may not be damaged. Accordingly, the resin may be provided in the accommodation opening of the metal mask after passing through a mesh opening of the mesh mask and may be coated with a large thickness on the rear surface of the display panel.

BRIEF DESCRIPTION OF THE DRAWINGS

The above and other advantages of the disclosure will become readily apparent by reference to the following detailed description when considered in conjunction with the accompanying drawings.

FIGS. 5A to 5H are schematic views illustrating a method of coating a resin using a mask device.

FIG. 7 is a schematic cross-sectional view taken along line IV-IV' shown in FIG. 6.

FIGS. 8A and 8B are schematic views illustrating a method of additionally coating a resin in a resin groove shown in FIG. 5H.

DETAILED DESCRIPTION OF THE EMBODIMENTS

Figure 1:
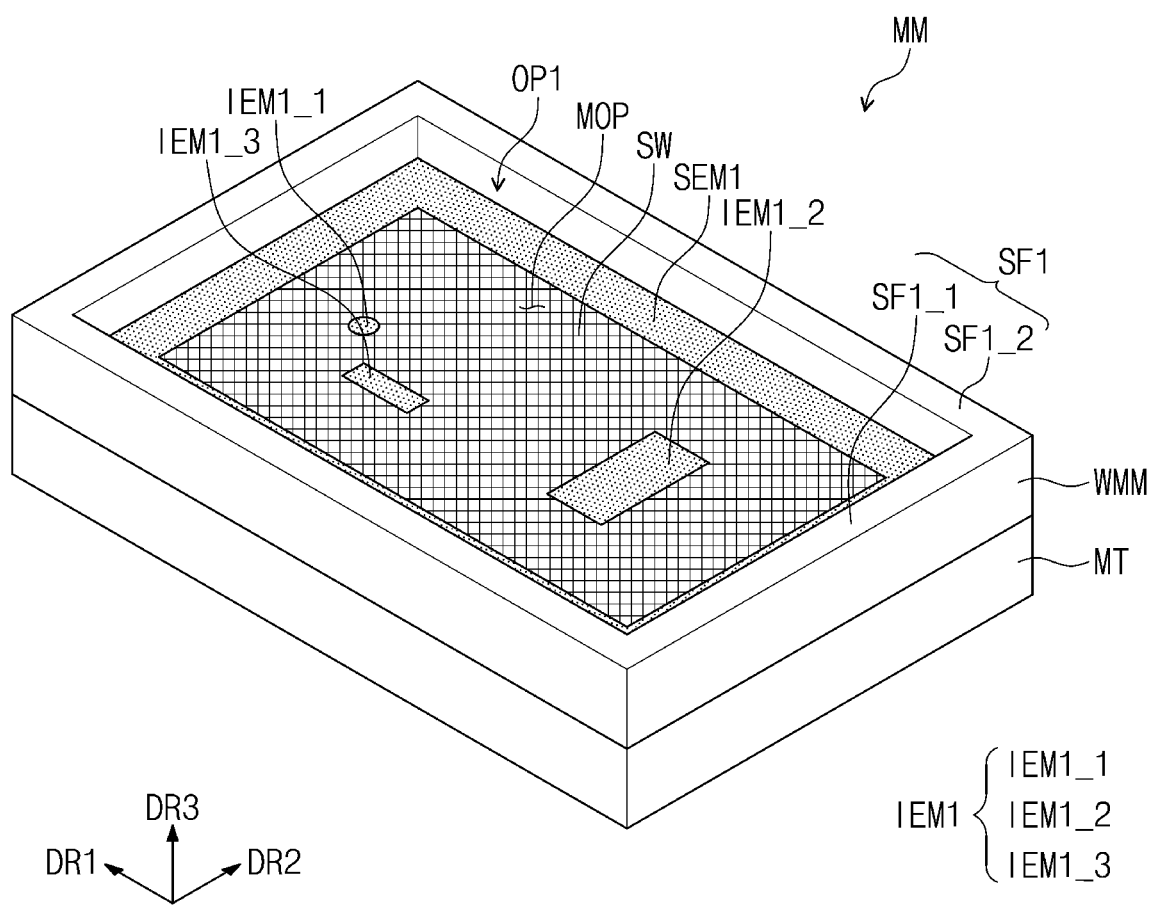
FIG. 1 is a schematic perspective view of a mask device according to an embodiment of the disclosure.

Features of the disclosure and methods of accomplishing the same may be understood more readily by reference to the following detailed description of preferred embodiments and the accompanying drawings. The disclosure may, however, be embodied in many different forms and should not be construed as being limited to the embodiments set forth herein. Rather, these embodiments are provided so that this disclosure will be more thorough and complete and will convey the disclosure to those skilled in the art, and the disclosure will only be defined by the appended claims. Like reference numerals denote like elements throughout the specification.

In the disclosure, it will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, such as "a" and "an," are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of the disclosure.

Embodiments described in the disclosure are described with reference to plan views and cross-sectional views that are ideal schematic diagrams. Accordingly, shapes of the exemplary views may vary depending on manufacturing technologies and/or tolerances. Thus, embodiments are not limited to shown specific forms and also include variations in form produced according to manufacturing processes. Therefore, regions illustrated in the drawings are exemplary, and the shapes of the regions illustrated in the drawings are intended to illustrate the specific shapes of the regions of elements and not to limit the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to accompanying drawings.

Figure 2:
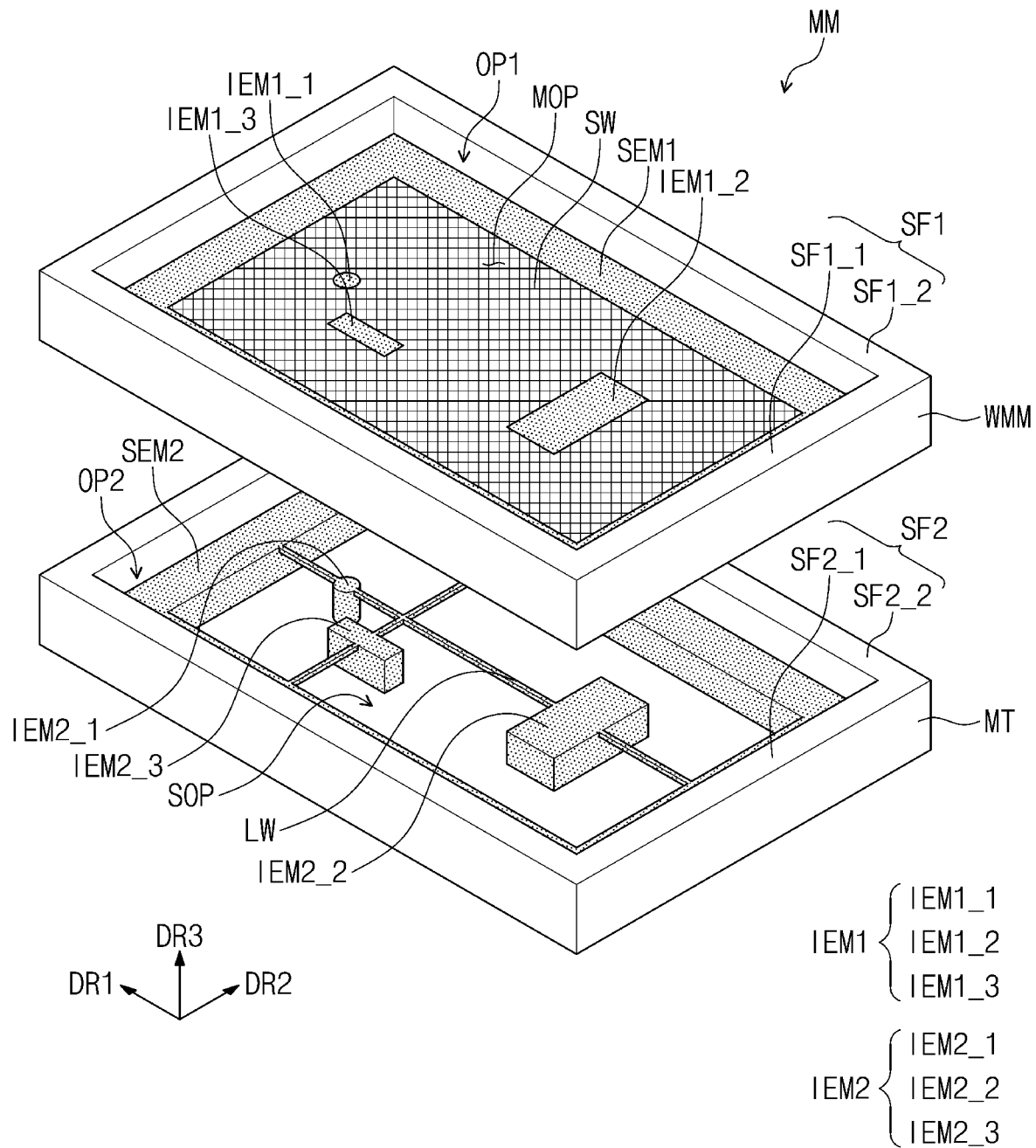
FIG. 2 is a schematic exploded perspective view of the mask device shown in FIG. 1.

FIG. 1 is a schematic perspective view of a mask device MM according to an embodiment of the disclosure, and FIG. 2 is a schematic exploded perspective view of the mask device MM shown in FIG. 1.

Referring to FIGS. 1 and 2, the mask device MM may include a mesh mask WMM and a metal mask MT. The mesh mask WMM may be disposed on the metal mask MT. The mesh mask WMM may have, for example, a frame shape. When viewed in a plane, the mesh mask WMM may include long sides extending in a first direction DR1 and short sides extending in a second direction DR2 crossing the first direction DR1.

Hereinafter, a direction substantially perpendicular to a plane defined by the first direction DR1 and the second direction DR2 may be referred to as a third direction DR3. In the disclosure, the expression "when viewed in a plane" may mean a state of being viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

The mesh mask WMM may include a first frame SF1, a mesh pattern SW, a first blocking frame SEM1, and first blocking portions IEM1. The first frame SF1 having a quadrangular frame shape may be provided with a first opening OP1 defined therethrough. When looking at the mesh mask WMM from the third direction DR3, the first opening OP1 may have a quadrangular shape.

The first frame SF1 may include a pair of first short side portions SF1_1 spaced apart from each other in the first direction DR1 and extending in the second direction DR2 and a pair of first long side portions SF1_2 extending in the first direction DR1 and spaced apart from each other in the second direction DR2.

The first blocking frame SEM1, the mesh pattern SW, and the first blocking portions IEM1 may be disposed in the first opening OP1. The first blocking frame SEM1, the mesh pattern SW, and the first blocking portions IEM1 will be described in detail with reference to FIG. 3.

The metal mask MT may be disposed under the mesh mask WMM. The metal mask MT may have, for example, a frame shape. When viewed in the plane (or in a plan view), the metal mask MT may include long sides extending in the first direction DR1 and short sides extending in the second direction DR2.

The metal mask MT may include a second frame SF2, a second blocking frame SEM2, second blocking portions IEM2, and connection wires LW.

The second frame SF2 having the quadrangular frame shape may be provided with a second opening OP2 defined therethrough. The second opening OP2 may overlap the first opening OP1. When viewed in the plane, the second opening OP2 may have a quadrangular shape. The second frame SF2 may include a pair of second short side portions SF2_1 spaced apart from each other in the first direction DR1 and extending in the second direction DR2 and a pair of second long side portions SF2_2 extending in the first direction DR1 and spaced apart from each other in the second direction DR2.

The second frame SF2 may overlap the first frame SF1. In an embodiment, each of the second short side portions SF2_1 may overlap a corresponding the first short side portion SF1_1 among the first short side portions SF1_1. Each of the second long side portions SF2_2 may overlap a corresponding the first long side portion SF1_2 among the first long side portions SF1_2. The second blocking frame SEM2, the second blocking portions IEM2, and the connection wires LW may be disposed in the second opening OP2. An accommodation opening SOP may be defined around the second blocking portions IEM2. The accommodation opening SOP may be defined between the second blocking portions IEM2 and the second blocking frame SEM2. The second blocking frame SEM2, the second blocking portions IEM2, and the connection wires LW will be described in detail with reference to FIG. 4.

Figure 3:
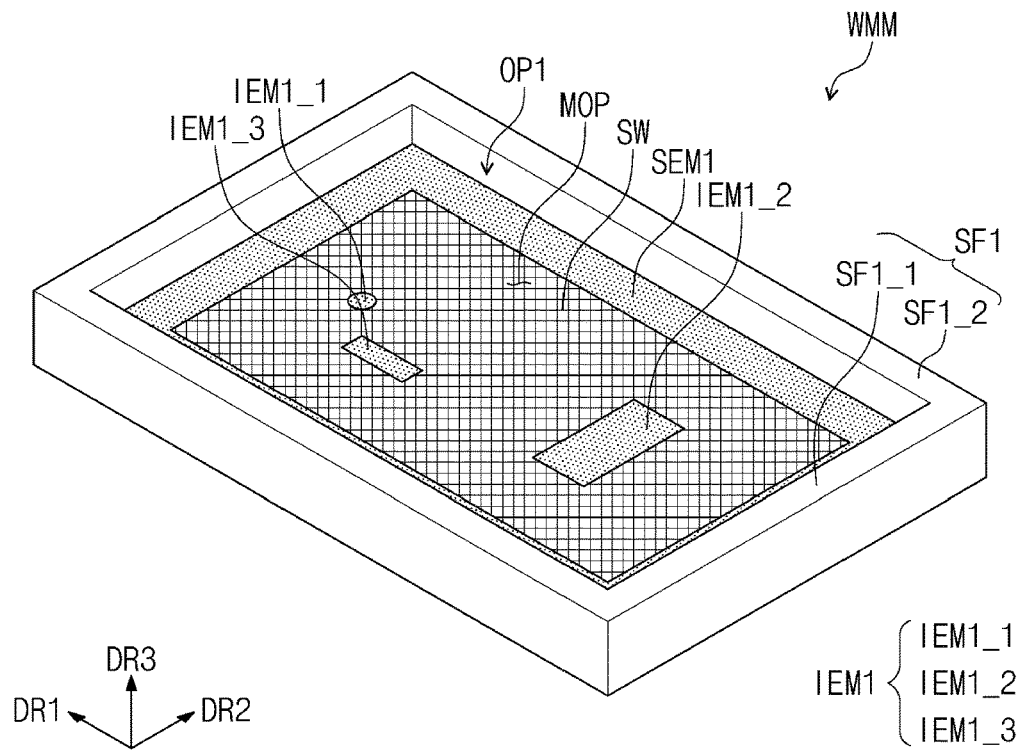
FIG. 3 is a schematic perspective view of a mesh mask shown in FIG. 2.

FIG. 3 is a schematic perspective view of the mesh mask WMM shown in FIG. 2.

In FIG. 3, details of the same elements, e.g., the first frame SF1 and the first opening OP1, as those described with reference to FIG. 2 will be omitted or briefly mentioned.

Referring to FIG. 3, the mesh mask WMM may include the first blocking frame SEM1, the mesh pattern SW, and the first blocking portions IEM1. The first blocking frame SEM1, the mesh pattern SW, and the first blocking portions IEM1 may be disposed in the first opening OP1.

The mesh pattern SW may be disposed in the first opening OP1 and may be connected to inner surfaces of the first frame SF1. The mesh pattern SW may have a plane shape defined by the first direction DR1 and the second direction DR2. The mesh pattern SW may include long sides extending in the first direction DR1 and short sides extending in the second direction DR2.

The mesh pattern SW may include metal wires. The metal wires may be arranged in a mesh shape. Mesh openings MOP may be defined between the metal wires arranged in the mesh shape. In an embodiment, the mesh openings MOP may have a lozenge shape, however, the disclosure should not be limited thereto or thereby. According to an embodiment, the mesh openings MOP may have a variety of shapes.

The first blocking portions IEM1 may be disposed in the mesh pattern SW. The first blocking portions IEM1 may be disposed in portions of the mesh pattern SW. The first blocking portions IEM1 may be disposed between the mesh openings MOP defined in the mesh pattern SW. In an embodiment, FIG. 3 shows three first blocking portions IEM1, however, the number of the first blocking portions IEM1 should not be limited thereto or thereby.

The first blocking portions IEM1 may include a material having a certain elasticity. The first blocking portions IEM1 may block a resin RS shown in FIG. 5C from passing through the mesh openings MOP.

In an embodiment, the first blocking portions IEM1 may include a first-first blocking portion IEM1_1, a first-second blocking portion IEM1_2, and a first-third blocking portion IEM1_3. The first-first blocking portion IEM1_1 may have a circular shape in an embodiment. The first-first blocking portion IEM1_1 may overlap an area in which a camera module CAM shown in FIG. 7 is disposed. The first-second blocking portion IEM1_2 may have a quadrangular shape in an embodiment. The first-second blocking portion IEM1_2 may overlap an area in which a battery BAT shown in FIG. 7 is disposed. The first-third blocking portion IEM1_3 may have a quadrangular shape as an example. The first-third blocking portion IEM1_3 may overlap an area in which a main processor MP shown in FIG. 7 is disposed.

The first blocking frame SEM1 may have a frame shape. The first blocking frame SEM1 may contact the inner surfaces of the first frame SF1 and may be connected to the inner surfaces of the first frame SF1. The inner surfaces of the first frame SF1 may be defined as surfaces opposite to outer surfaces of the first frame SF1, which are toward an outside. The first opening OP1 may be defined by the inner surfaces of the first frame SF1.

The first blocking frame SEM1 may surround the mesh pattern SW and the first blocking portions IEM1. The mesh pattern SW may be connected to the inner surfaces of the first frame SF1 by the first blocking frame SEM1.

Figure 4:
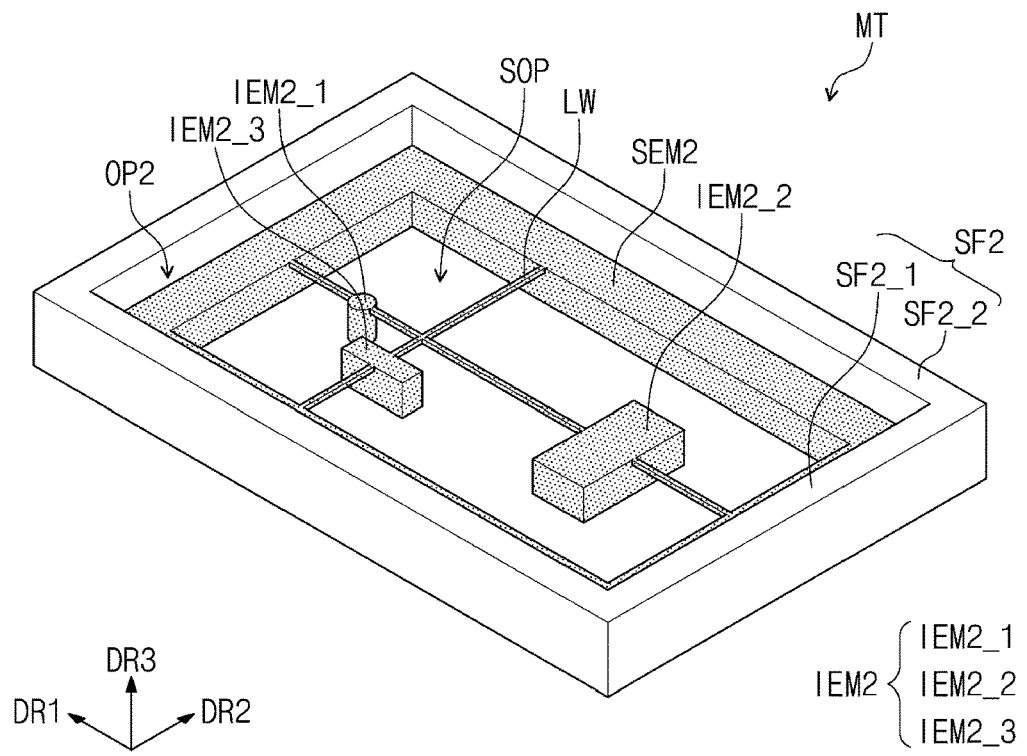
FIG. 4 is a schematic perspective view of a metal mask shown in FIG. 2.

FIG. 4 is a schematic perspective view of the metal mask MT shown in FIG. 2.

In FIG. 4, details of the same elements, e.g., the second frame SF2, the second opening OP2, and the accommodation opening SOP, as those described with reference to FIG. 2 will be omitted or briefly mentioned.

Referring to FIG. 4, the metal mask MT may include the second blocking frame SEM2, the second blocking portions IEM2, and the connection wires LW. The second blocking frame SEM2, the second blocking portions IEM2, and the connection wires LW may be disposed in the second opening OP2.

The number of the second blocking portions IEM2 may be substantially equal to each other as the number of the first blocking portions IEM1 shown in FIG. 3. When viewed in the plane, each of the second blocking portions IEM2 may overlap a corresponding first blocking portion IEM1 among the first blocking portions IEM1 shown in FIG. 3. When viewed in the plane, the second blocking portions IEM2 may have substantially identical or similar shape to the first blocking portions IEM1.

The second blocking portions IEM2 may include a second-first blocking portion IEM2_1, a second-second blocking portion IEM2_2, and a second-third blocking portion IEM2_3. The second-first blocking portion IEM2_1 may have, for example, a cylindrical shape. The second-first blocking portion IEM2_1 may overlap the area in which the camera module CAM shown in FIG. 7 is disposed. The second-second blocking portion IEM2_2 may have, for example, a cuboid shape. The second-second blocking portion IEM2_2 may overlap the area in which the battery BAT shown in FIG. 7 is disposed. The second-third blocking portion IEM2_3 may have, for example, a cuboid shape. The second-third blocking portion IEM2_3 may overlap the area in which the main processor MP shown in FIG. 7 is disposed.

The connection wires LW may be connected to upper portions of the second blocking portions IEM2. The second blocking portions IEM2 may be connected to the second frame SF2 by the connection wires LW. A connection wire LW of the connection wires LW may extend in the first direction DR1 and may be connected to inner surfaces of the second short side portions SF2_1 spaced apart from each other in the first direction DR1. Another connection wire LW of the connection wires LW may extend in the second direction DR2 and may be connected to inner surfaces of the second long side portions SF2_2 spaced apart from each other in the second direction DR2. The connection wires LW may be connected to the second blocking frame SEM2 described below.

The second blocking frame SEM2 may contact inner surfaces of the second frame SF2 and may be connected to the inner surfaces of the second frame SF2. The inner surfaces of the second frame SF2 may be defined as surfaces opposite to outer surfaces of the second frame SF2, which are toward an outside. The second opening OP2 may be defined by the inner surfaces of the second frame SF2. The second blocking frame SEM2 may have a frame shape.

The second blocking frame SEM2 may surround the second blocking portions IEM2 and the connection wires LW. When viewed in the plane, the second blocking frame SEM2 may overlap the first blocking frame SEM1 shown in FIG. 3. The accommodation opening SOP may be defined between the second blocking frame SEM2 and the second blocking portions IEM2.

FIGS. 5A to 5H are schematic views illustrating a method of coating a resin RS using the mask device MM shown in FIG. 1.

Figure 5A:
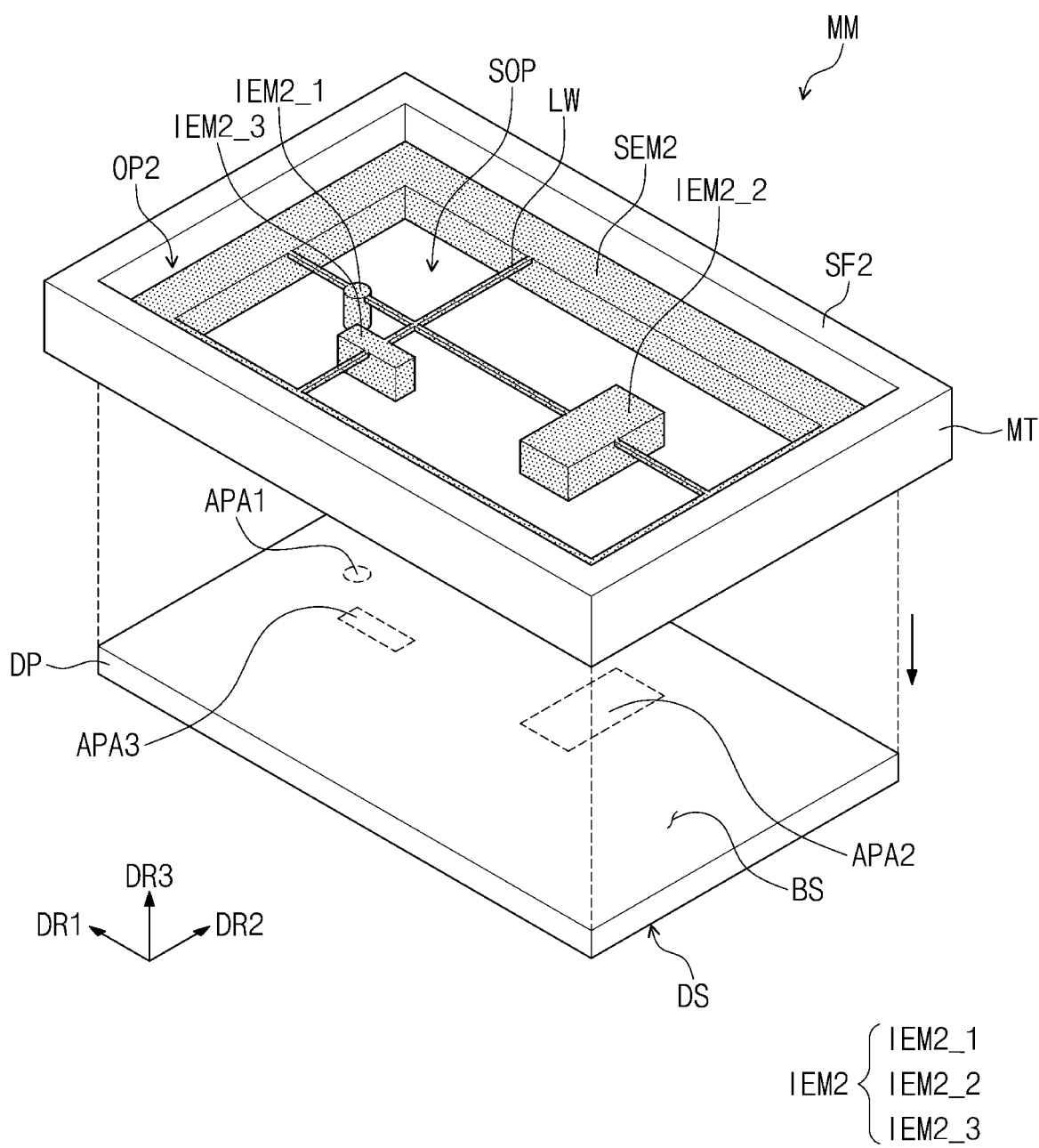
Figure 5B:
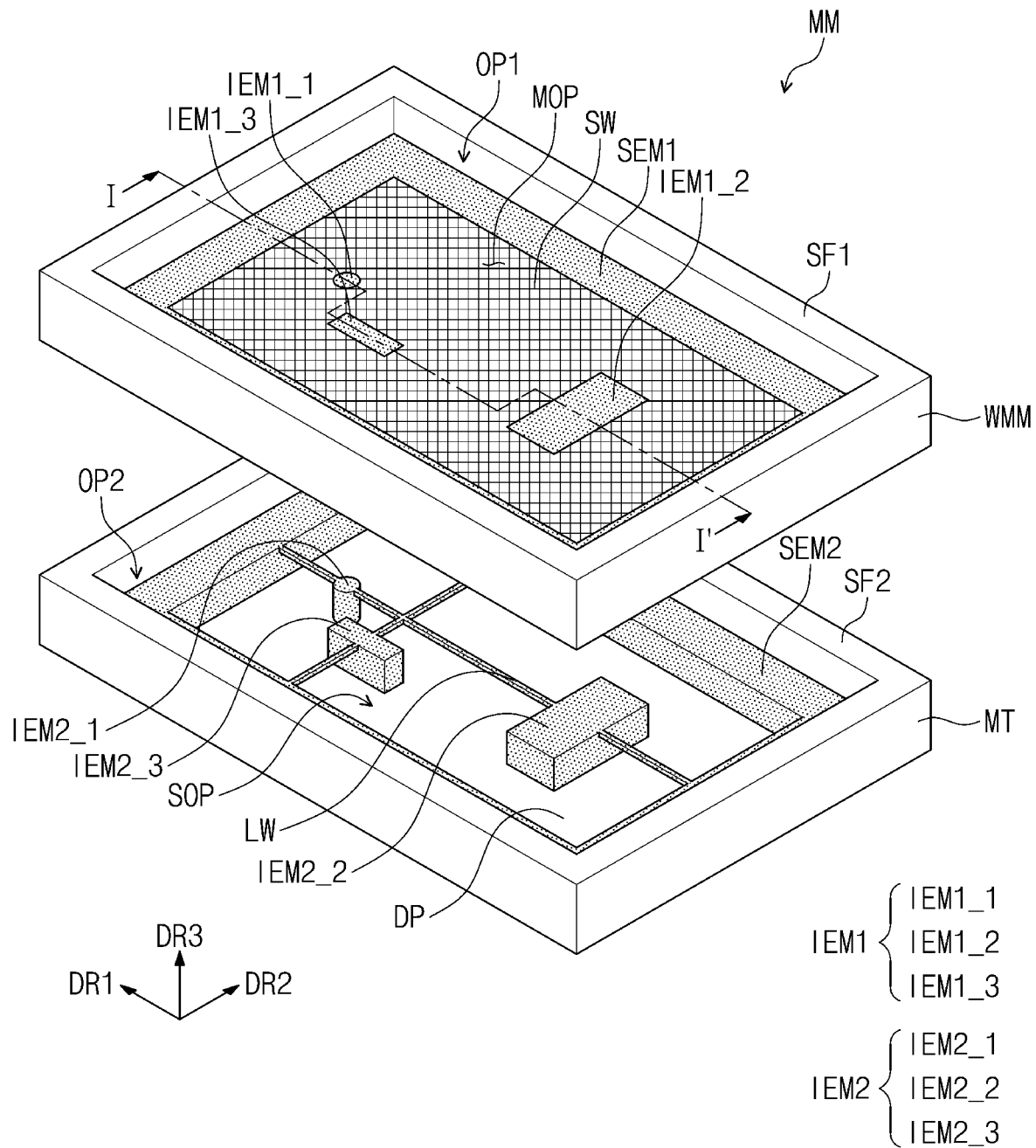
Figure 5C:
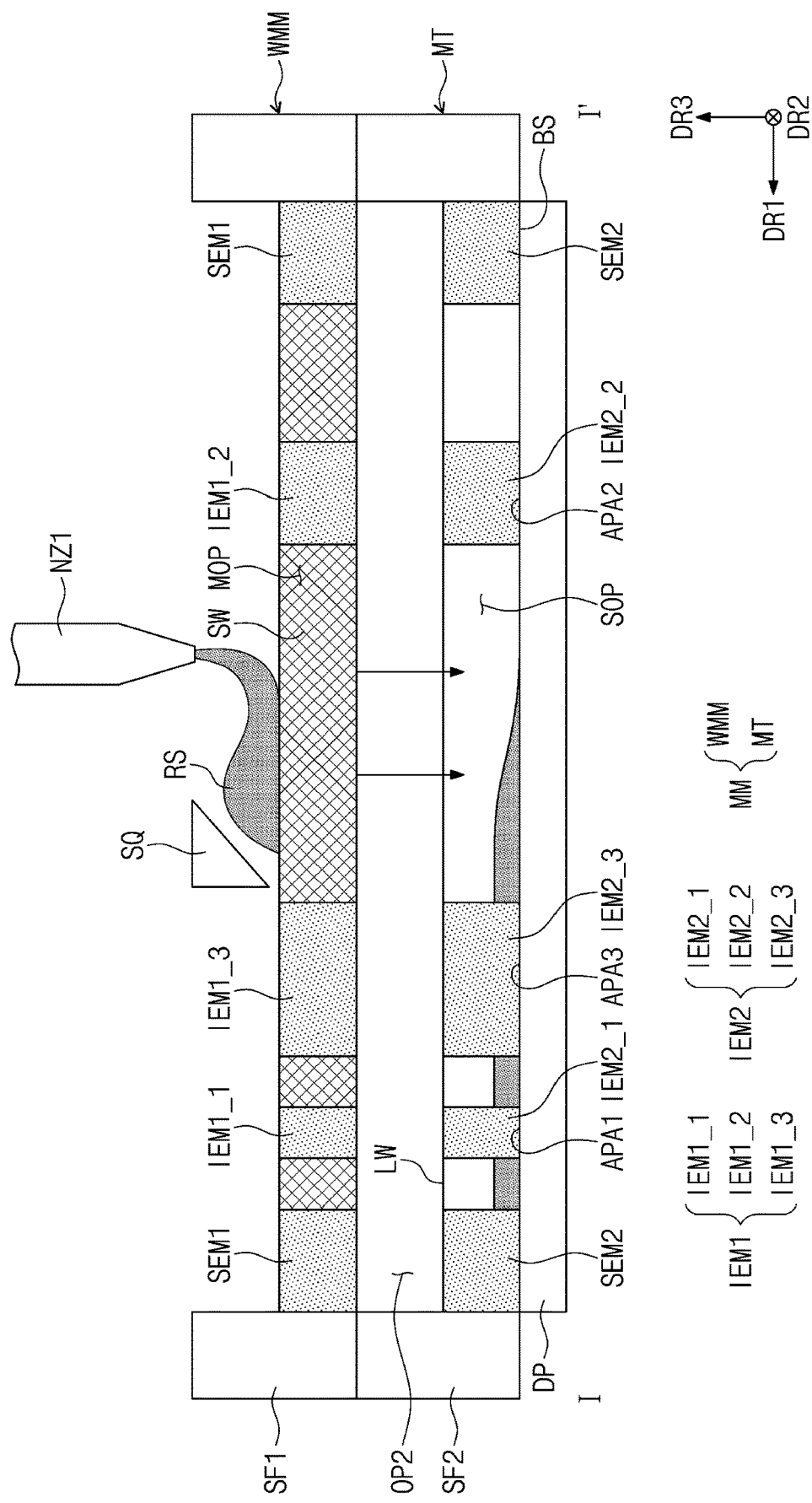
Figure 5D:
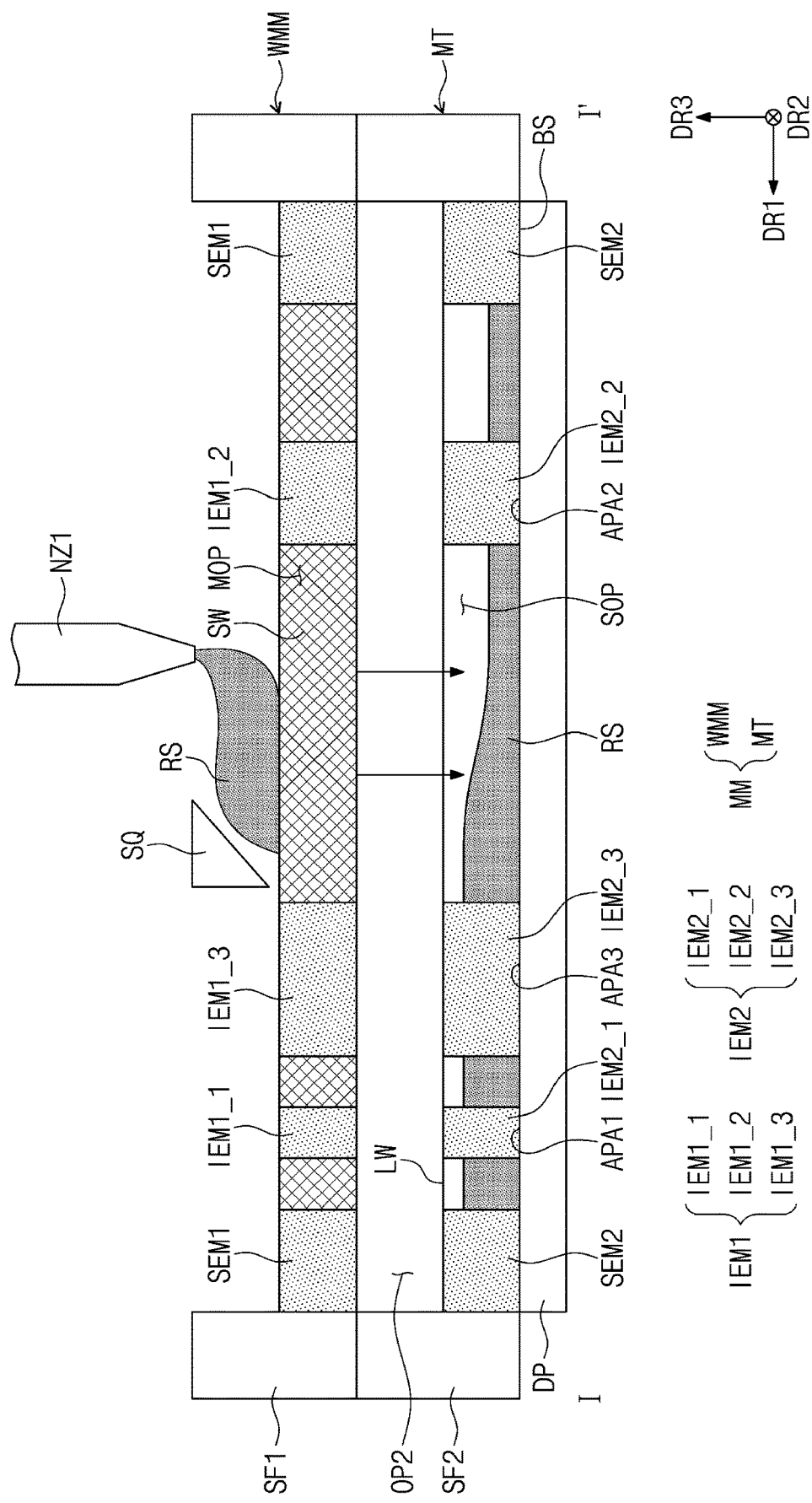
Figure 5E:
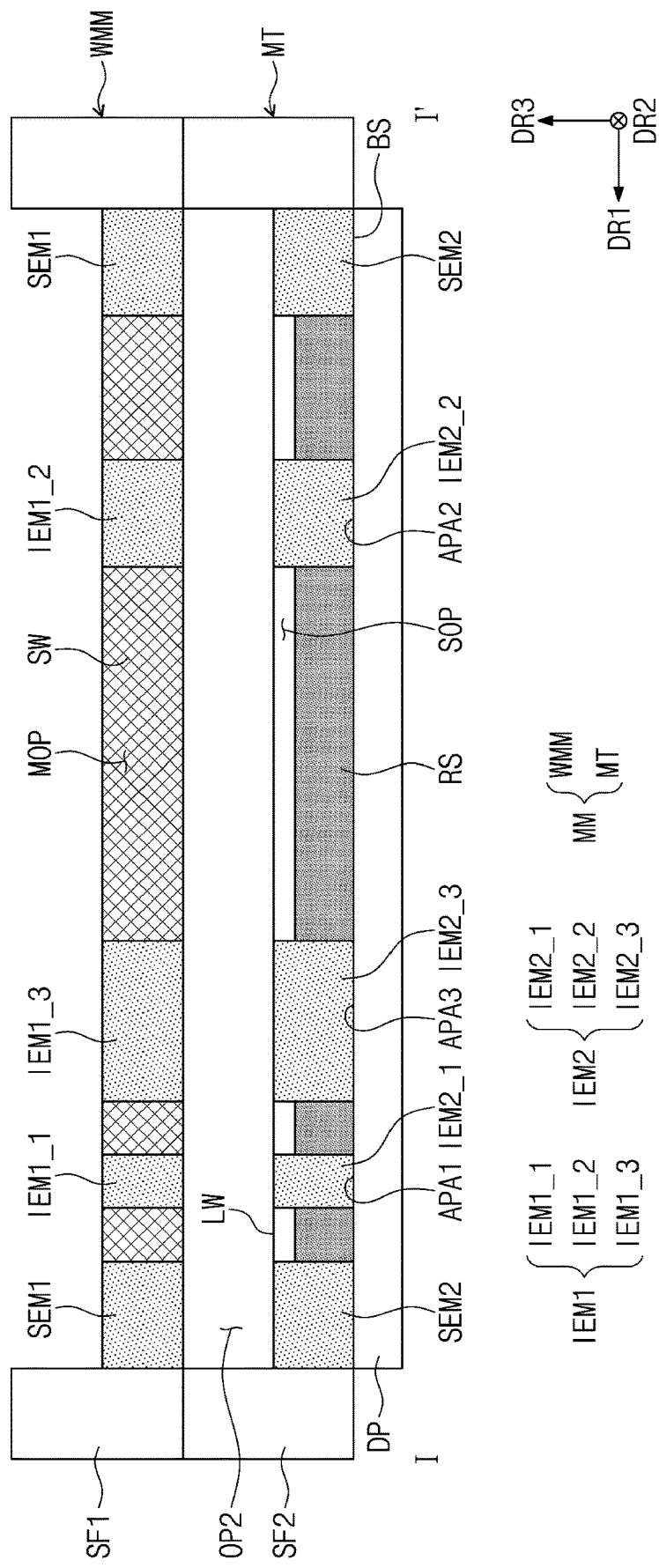
Figure 5F:
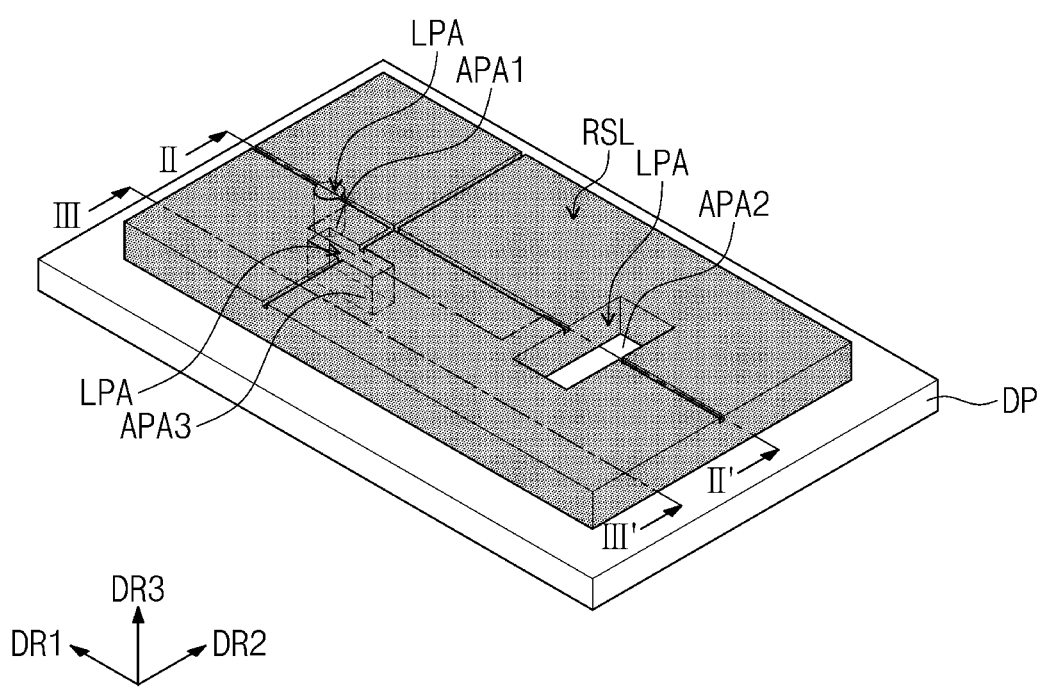

FIGS. 5A and 5B are schematic perspective views of the mask device MM. FIGS. 5C to 5E are schematic cross-sectional views taken along line I-I' of FIG. 5B. FIG. 5F is a schematic perspective view of display panel DP and accommodation pattern RSL. FIG. 5G is a schematic cross-sectional view taken along line II-II' of FIG. 5F. FIG. 5H is a schematic cross-sectional view taken along line III-III' of FIG. 5F.

Detailed configurations of the mesh mask WMM and the metal mask MT of FIGS. 5A to 5E are the same as described with reference to FIGS. 1 to 4, and thus, details thereof are omitted.

Referring to FIG. 5A, a display panel DP may include a display surface DS displaying an image to a user and a rear surface BS opposite to the display surface DS in the third direction DR3. The metal mask MT may be disposed on the rear surface BS of the display panel DP. When viewed in the plane, the display panel DP may overlap the second opening OP2.

The display panel DP may be provided with accommodation areas APA1, APA2, and APA3 defined therein. When viewed in the plane, the accommodation areas APA1, APA2, and APA3 may overlap the second blocking portions IEM2. When viewed in the plane, the accommodation areas APA1, APA2, and APA3 may not overlap the accommodation opening SOP. The battery BAT, the camera module CAM, and the main processor MP described with reference to FIG. 7 may be disposed in the accommodation areas APA1, APA2, and APA3.

Referring to FIG. 5B, the mesh mask WMM may be disposed on the metal mask MT. When viewed in the plane, the first frame SF1 may overlap the second frame SF2. When viewed in the plane, the first opening OP1 may overlap the second opening OP2. When viewed in the plane, each of the first blocking portions IEM1 may overlap a corresponding second blocking portion IEM2 among the second blocking portions IEM2. When viewed in the plane, the connection wires LW may overlap the mesh pattern SW.

Referring to FIG. 5C, a lower surface of the second blocking frame SEM2 may contact the rear surface BS of the display panel DP. The second blocking frame SEM2 may be spaced apart from the first blocking frame SEM1 in the third direction DR3. Upper surfaces of the second frame SF2 may contact lower surfaces of the first frame SF1. When viewed in the plane, the first blocking portions IEM1 may not overlap the accommodation opening SOP.

A squeezer SQ and a first nozzle NZ1 may be disposed above the mask device MM. The squeezer SQ and the first nozzle NZ1 may be disposed above the mesh mask WMM. The first nozzle NZ1 may spray (or discharge) the resin RS to an upper surface of the mesh mask WMM. The first nozzle NZ1 may spray the resin RS to the mesh pattern SW and the first blocking portions IEM1. The resin RS may include a heat curable resin, a light curable resin, or the like.

When the resin RS is sprayed from the first nozzle NZ1, the squeezer SQ may push the resin RS to a direction. The resin RS may pass through the mesh openings MOP by the squeezer SQ. The resin RS may be blocked by the first blocking portions IEM1. The resin RS may be blocked by the first blocking frame SEM1.

The resin RS may pass through the mesh openings MOP in an area except the first blocking portions IEM1 and the first blocking frame SEM1, e.g., an area overlapping the accommodation opening SOP. The resin RS may be provided to the metal mask MT after passing through the mesh openings MOP. The resin RS may be provided to the accommodation opening SOP. The resin RS may be blocked by the second blocking portions IEM2. That is, the resin RS may be provided to the accommodation opening SOP around the second blocking portions SEM2 without being provided onto the second blocking portions IEM2. The resin RS provided to the accommodation opening SOP may be provided on the rear surface BS of the display panel DP.

Since the accommodation areas APA1, APA2, and APA3 overlap the second blocking portions IEM2, the resin RS may be provided to an area except the accommodation areas APA1, APA2, and APA3.

Referring to FIGS. 5D and 5E, the resin RS may be provided multiple times to the display panel DP. In an embodiment, the resin RS may be provided multiple times to the display panel DP using the first nozzle NZ1 and the squeezer SQ to increase a thickness of the resin RS provided to the rear surface BS of the display panel DP.

Referring to FIGS. 5F and 5G, the resin RS provided to the rear surface BS of the display panel DP may be cured by a heat or ultraviolet ray. Then, the mask device MM may be removed from the display panel DP. When the resin RS is cured, accommodation spaces LPA may be defined on the accommodation areas APA1, APA2, and APA3. The accommodation spaces LPA may be referred to as recessed portions. A structure in which the accommodation spaces LPA are defined by the cured resin RS may be referred to as an accommodation pattern RSL.

The accommodation pattern RSL may be disposed on the rear surface BS of the display panel DP. A thickness in the third direction DR3 of the accommodation pattern RSL may be within a range of about 100 micrometers to about 150 micrometers.

The accommodation spaces LPA may overlap the second blocking portions IEM2 of FIGS. 5A to 5E.

Referring to FIG. 5H, a resin groove RSG may be defined in an upper portion of the accommodation pattern RSL. The resin groove RSG may overlap the connection wires LW shown in FIGS. 5A to 5E. The resin groove RSG may extend in the first direction DR1 or the second direction DR2 along the connection wires LW.

In an embodiment where the resin RS is coated using only the mesh mask WMM in case that the resin RS is sprayed to the rear surface BS of the display panel DP, the squeezer SQ may apply a force to the mesh pattern SW. In case that the force is applied to the mesh pattern SW, the mesh pattern SW may sag more as a distance from the first blocking frame SEM1 increases. Accordingly, the mesh pattern SW may contact the rear surface BS of the display panel DP, and the resin RS may not be coated in a contact area between the mesh pattern SW and the rear surface BS of the display panel DP. As a result, a thickness of the coated resin RS may be smaller than about 100 micrometers.

In an embodiment where the resin RS is coated using only the metal mask MT in case that the resin RS is sprayed to the rear surface BS of the display panel DP, the connection wires LW may contact the squeezer SQ while the squeezer SQ pressurizes the resin RS. The connection wires LW may be damaged while contacting the squeezer SQ. Accordingly, the second blocking portions IEM2 connected to the second frame SF2 by the connection wires LW may be separated from the metal mask MT.

However, in an embodiment where the resin RS is coated on the rear surface BS of the display panel DP using the mask device MM according to the disclosure, even though the mesh pattern SW is pressurized by the squeezer SQ, the mesh pattern SW may not contact the display panel DP by the metal mask MT disposed under the mesh pattern SW. Since the squeezer SQ does not contact the connection wires LW arranged on the metal mask MT by the mesh mask WMM, the connection wires LW may not be damaged. Accordingly, the resin RS may be provided to the accommodation opening SOP after passing through the mesh opening MOP, and the resin RS may be coated with a large thickness.

Figure 6:
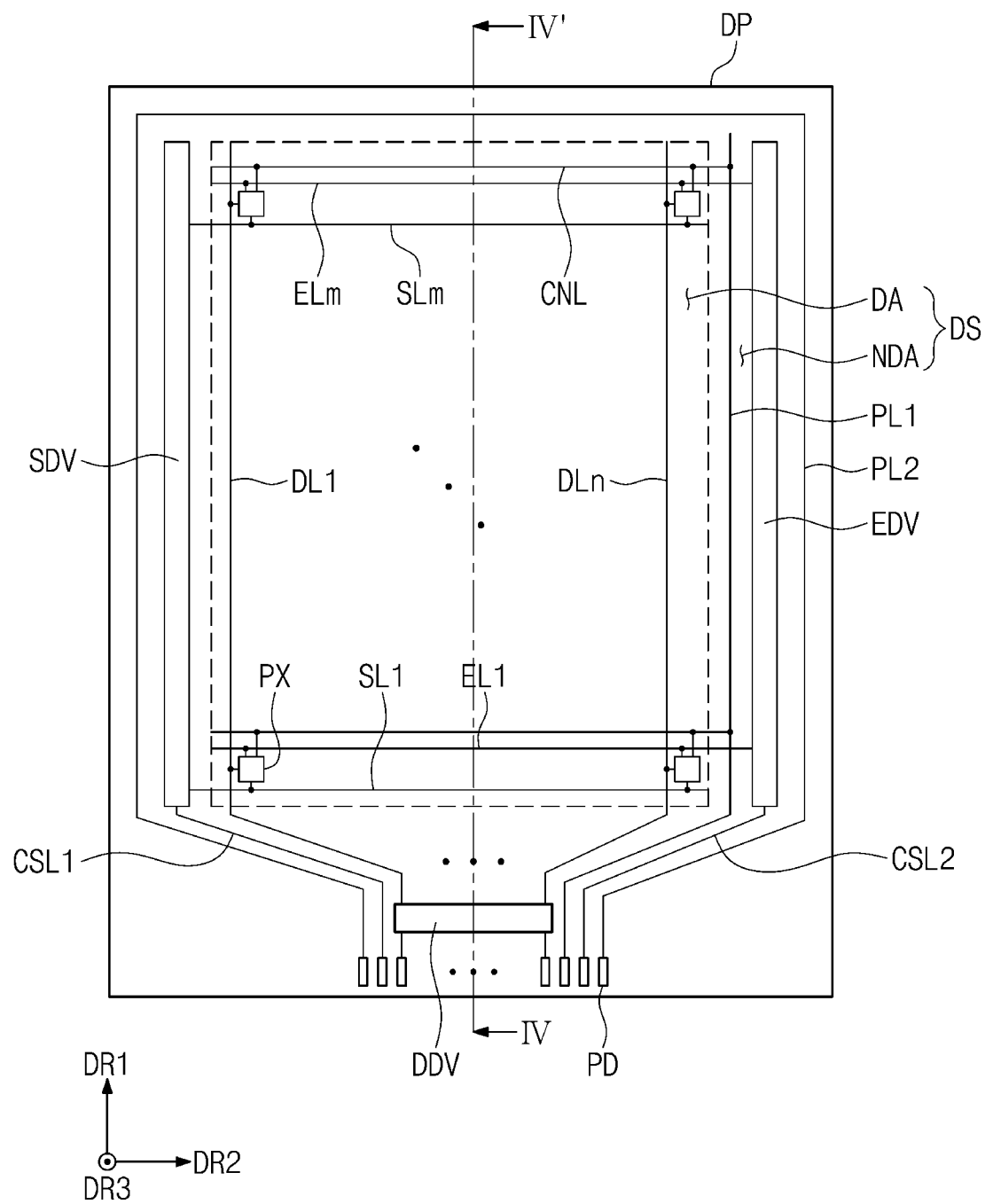
FIG. 6 is a schematic plan view of a display panel shown in FIGS. 5A to 5H.

FIG. 6 is a schematic plan view of the display panel DP shown in FIGS. 5A to 5H, and FIG. 7 is a schematic cross-sectional view taken along line IV-IV' shown in FIG. 6.

FIG. 7 shows a structure in which the rear surface BS is placed at a relatively upper position and a display surface DS is placed at a relatively lower position in an embodiment.

Referring to FIG. 6, the display panel DP may have a rectangular shape defined by long sides extending in the first direction DR1 and short sides extending in the second direction DR2, however, the shape of the display panel DP should not be limited to the rectangular shape. The display surface DS may include the display part DA and a non-display part NDA surrounding the display part DA.

The display panel DP may be a light-emitting type display panel. For example, the display panel DP may be an organic light emitting display panel or an inorganic light emitting display panel. A light emitting layer of the organic light emitting display panel may include an organic light emitting material, or the like. A light emitting layer of the inorganic light emitting display panel may include a quantum dot, a quantum rod, or the like. Hereinafter, the display panel DP will be described as the organic light emitting display panel.

The display panel DP may include pixels PX, scan lines SL1 to SLm, data lines DL1 to DLn, emission lines EL1 to ELm, first and second control lines CSL1 and CSL2, first and second power lines PL1 and PL2, connection lines CNL, and pads PD. Each of m and n is a natural number.

The pixels PX may be arranged in the display part DA. A scan driver SDV and an emission driver EDV may be disposed in the non-display part NDA to be each adjacent to the long sides of the display panel DP. A data driver DDV may be disposed in the non-display part NDA to be adjacent to a short side of the short sides of the display panel DP. When viewed in the plane, the data driver DDV may be disposed to be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the emission driver EDV.

The first power line PL1 may extend in the first direction DR1 and may be disposed in the non-display part NDA. The first power line PL1 may be disposed between the display part DA and the emission driver EDV, however, it should not be limited thereto or thereby. For example, the first power line PL1 may be disposed between the display part DA and the scan driver SDV.

The connection lines CNL may extend in the second direction DR2 and may be arranged in the first direction DR1. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display part NDA. The second power line PL2 may extend along the long sides of the display panel DP and the other short side of the short sides of the display panel DP at which the data driver DDV is not disposed. The second power line PL2 may be disposed outside the scan driver SDV and the emission driver EDV.

Although not shown in figures, the second power line PL2 may extend to the display part DA and may be connected to the pixels PX. A second voltage having a level lower than a level of the first voltage may be applied to the pixels PX through the second power line PL2.

The first control line CSL1 may be connected to the scan driver SDV and may extend toward the lower end of the display panel DP when viewed in the plane. The second control line CSL2 may be connected to the emission driver EDV and may extend toward the lower end of the display panel DP when viewed in the plane. The data driver DDV may be disposed between the first control line CSL1 and the second control line CSL2.

The pads PD may be arranged on the display panel DP. The pads PD may be arranged closer to the lower end of the display panel DP than the data driver DDV is. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not shown in figures, a timing controller to control an operation of the scan driver SDV, the data driver DDV, and the emission driver EDV and a voltage generator to generate the first and second voltages may be disposed on a printed circuit board. The timing controller and the voltage generator may be connected to corresponding pads PD via the printed circuit board.

The scan driver SDV may generate scan signals, and the scan signals may be applied to the pixels PX via the scan lines SL1 to SLm. The data driver DDV may generate data voltages, and the data voltages may be applied to the pixels PX via the data lines DL1 to DLn. The emission driver EDV may generate emission signals, and the emission signals may be applied to the pixels PX via the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Referring to FIG. 7, in an embodiment, the camera module CAM, the main processor MP, and the battery BAT may be arranged on the rear surface BS of the display panel DP.

The camera module CAM may take a picture of an image of an external object. The main processor MP may control an overall operation of the display panel DP. The battery BAT may supply a power to the display panel DP.

Each of the camera module CAM, the main processor MP, and the battery BAT may be disposed in a corresponding accommodation space LPA among the accommodation spaces LPA. The camera module CAM, the main processor MP, and the battery BAT may be disposed in the accommodation spaces LPA defined through in the accommodation pattern RSL.

FIGS. 8A and 8B are schematic views illustrating a method of additionally coating the resin RS in the resin groove RSG shown in FIG. 5H.

FIGS. 8A and 8B are schematic cross-sectional views taken along line III-III' of FIG. 5F.

Referring to FIGS. 8A and 8B, a second nozzle NZ2 may be disposed above the accommodation pattern RSL. The second nozzle NZ2 may additionally provide the resin RS into the resin groove RSG. When the resin groove RSG is filled with the resin RS and the resin RS provided to the resin groove RSG is cured, a depth of the resin groove RSG may be reduced, or the resin groove RSG may disappear.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of coating a resin, comprising:
   placing a metal mask directly on a display panel;
   placing a mesh mask on the metal mask;
   providing a resin on an upper surface of the mesh mask; and
   providing the resin onto the display panel through the mesh mask and then through the metal mask, wherein the mesh mask comprises:
   a mesh pattern; and
   a plurality of first blocking portions disposed in the mesh pattern to block portions of the mesh pattern,
   the metal mask comprises a plurality of second blocking portions overlapping the first blocking portions in a plan view, the metal mask is provided with an accommodation opening defined through the metal mask, and not overlapping the first blocking portions in a plan view, and the resin is provided to the accommodation opening after passing through the mesh pattern around the first blocking portions;

wherein the second blocking portions of the metal mask directly contact the display panel when the metal mask is directly on the display panel.

2. The method of claim 1, wherein the resin is blocked by the first blocking portions and provided to the metal mask after passing through mesh openings defined through the mesh pattern around the first blocking portions.

3. The method of claim 2, wherein the resin provided to the metal mask is blocked by the second blocking portions and provided to the accommodation opening around the second blocking portions.

4. The method of claim 1, wherein the mesh mask further comprises a first frame having a frame shape to define a first opening, the metal mask further comprises:

a second frame different from the first frame and the second frame having a frame shape to define a second opening; and a plurality of connection wires connecting the second blocking portions to the second frame, the mesh pattern is connected to inner surfaces of the first frame, and the connection wires are connected to inner surfaces of the second frame.

5. The method of claim 4, wherein resin grooves are defined in portions of the resin overlapping the connection wires in a plan view.

6. The method of claim 1, wherein the second blocking portions are spaced apart from the first blocking portions in a cross-sectional view.

7. The method of claim 1, wherein respective lower surfaces of the first blocking portions and the mesh pattern are coplanar.

8. The method of claim 1, wherein the metal mask comprises a plurality of connection wires spaced apart from the metal mask and connecting the second blocking portions to a frame of the metal mask.

9. The method of claim 1, further comprising:

placing a squeezer above the mesh mask; and causing the squeezer to push the resin to allow the resin to pass through the mesh pattern.

* * * * *